(12) United States Patent
Jörger et al.

(10) Patent No.: US 6,569,758 B2
(45) Date of Patent: May 27, 2003

(54) SUB-MILLIOHM ON-CHIP INTERCONNECTION

(75) Inventors: Wolfgang Jörger, Wieslodi (DE); Achim Stellberger, Kronan (DE); Michael Keller, Heideberg (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 09/998,666

(22) Filed: Dec. 3, 2001

(65) Prior Publication Data

US 2003/0080416 A1 May 1, 2003

(30) Foreign Application Priority Data

Oct. 29, 2001 (EP) ............................................. 01640005

(51) Int. Cl.[7] ............................................. H01L 21/4761
(52) U.S. Cl. ........................ 438/620; 438/622; 438/612
(58) Field of Search ................................. 438/612, 613, 438/614, 615, 620, 643, 660, 627, 622; 257/21, 22, 23, 780, 781

(56) References Cited

U.S. PATENT DOCUMENTS

| | | | |
|---|---|---|---|
| 4,434,347 A | * 2/1984 | Kurtz et al. | 219/56.21 |
| 4,891,333 A | * 1/1990 | Baba et al. | 219/148 |
| 5,032,889 A | 7/1991 | Murao et al. | 357/40 |
| 5,229,916 A | * 7/1993 | Frankeny et al. | 174/254 |
| 5,313,084 A | * 5/1994 | Wei | 257/382 |
| 5,346,860 A | * 9/1994 | Wei | 438/622 |
| 5,451,977 A | * 9/1995 | Kusuda et al. | 257/21 |
| 5,495,667 A | * 3/1996 | Farnworth et al. | 174/260 |
| 5,498,569 A | * 3/1996 | Eastep | 438/3 |
| 5,673,845 A | * 10/1997 | Ball | 228/180.5 |
| 5,869,357 A | 2/1999 | Zambrano | 438/129 |
| 6,187,673 B1 | * 2/2001 | Lai et al. | 438/643 |
| 6,384,486 B2 | * 5/2002 | Zuniga et al. | 257/780 |
| 6,419,145 B2 | * 7/2002 | Ball | 228/180.5 |
| 6,444,565 B1 | * 9/2002 | Feild et al. | 438/622 |

FOREIGN PATENT DOCUMENTS

| | | | |
|---|---|---|---|
| EP | 0418802 A2 | 9/1990 | H01L/23/52 |
| GB | 2095904 A | 2/1982 | H01L/23/48 |
| JP | 06061288 | 3/1994 | H01L/21/60 |
| JP | 2000133730 | 5/2000 | H01L/21/8249 |

\* cited by examiner

Primary Examiner—Carl Whitehead, Jr.
Assistant Examiner—Laura M Schillinger
(74) Attorney, Agent, or Firm—George O. Saile; Stephen B. Ackerman; Douglas R. Schnabel

(57) ABSTRACT

A method to form a very low resistivity interconnection in the manufacture of an integrated circuit device is achieved. A bottom conductive layer is formed overlying a substrate. The bottom conductive layer creates a first electrical coupling of a first location and a second location of the integrated circuit device. A dielectric layer is formed overlying the bottom conductive layer. A top conductive layer is formed overlying the dielectric layer. The top conductive layer is coupled to the bottom conductive layer through openings in the dielectric layer to form a second electrical coupling of the first location and the second location. A metal wire is bonded to the top conductive layer to form a third electrical coupling of the first location and the second location to complete the very low resistivity interconnection in the manufacture of the integrated circuit device.

20 Claims, 7 Drawing Sheets

SUB-MILLIOHM ON-CHIP INTERCONNECTION

BACKGROUND OF THE INVENTION (1) Field of the Invention

The invention relates to interconnect techniques in an integrated circuit device, and more particularly, to a very low resistivity interconnection method and structure using bonded metal wires.

(2) Description of the Prior Art

Internal interconnects of integrated circuit devices are typically formed using metal films that have been deposited and patterned. These metal films provide low resistivity connections between the various active and passive devices and layers in the circuit. In certain applications, such as high power devices, the resistivity of the metal film lines is too large.

Referring now to FIG. 1, an exemplary prior art integrated circuit is illustrated in cross section. In this example, two MOS transistors 34 and 38 are formed on a substrate 10. The transistors 34 and 38 have source/drain regions A, B, and C 14 comprising a patterned diffusion layer 14 in the substrate 10. In this example, the circuit requires that source/drain regions A and B be coupled together through a low resistivity path while region C is not connected to A and B. To form the coupling path, a first metal layer 22 contacts the source/drain regions 14. A second metal layer 30 contacts the first metal layer 22 and couples region A to region B via the bridge 54 of second metal layer 30. A first metal layer section 50 contacts the C region.

Referring now to FIG. 2, a simplified model of the prior art example circuit is shown. The model shows the coupling metals sections as resistors $R_{METAL1}$ 50 and $R_{METAL2}$ 54. The resistance between nodes A and B is the resistance of the first and second metal paths including the bridge 54. This resistance $R_{METAL2}$ 54 depends on the resistivity characteristics of the deposited metal film. If the resistance is too high, it can only be made lower by increasing the width of the metal connection. However, space limitations on the circuit die restrict the metal size. In addition, the presence of the C region eliminates the use of the first metal layer as a parallel interconnect path for A and B. In a high power application, where a large current flow may cause a large IR drop, the integrated circuit process may not be capable of creating an interconnect of low enough resistance using the available metal film layers.

Several prior art inventions describe the application of bonded wire to integrated circuit devices. U.S. Pat. No. 5,032,889 to Murao et al describes a wafer-scale integrated circuit device where functional blocks on the wafer are interconnected using a combination of metal layer lines on the IC and bonding wires to thereby improve reliability. U.S. Pat. No. 5,869,357 to Zambrano discloses a metallization and wire bonding process for a power semiconductor device.

SUMMARY OF THE INVENTION

A principal object of the present invention is to provide an effective and very manufacturable method for forming a low resistivity interconnection in an integrated circuit device.

A further object of the present invention is to provide a method to reduce interconnect resistivity while using a minimum of circuit area.

A still further object of the present invention is to reduce interconnect resistivity by bonding metal wire or stitches to the uppermost metal interconnect layer.

A yet still further object of the present invention is to combine multiple bonded metal wire interconnects with multiple conductive layers to minimize resistivity.

Another object of the present invention is to provide a low resistivity structure for connecting diffusion regions, such as MOS source/drain regions.

In accordance with the objects of this invention, a method to form a very low resistivity interconnection in the manufacture of an integrated circuit device is achieved. A bottom conductive layer is formed overlying a substrate. The bottom conductive layer creates a first electrical coupling of a first location and a second location of the integrated circuit device. A dielectric layer is formed overlying the bottom conductive layer. A top conductive layer is formed overlying the dielectric layer. The top conductive layer is coupled to the bottom conductive layer through openings in the dielectric layer such that the top conductive layer creates a second electrical coupling of the first location and the second location. A metal wire is bonded to the top conductive layer such that the metal wire creates a third electrical coupling of the first location and the second location to complete the very low resistivity interconnection in the manufacture of the integrated circuit device.

Also in accordance with the objects of the present invention, a method to form a very low resistivity interconnection between two source/drain regions in the manufacture of an integrated circuit device us achieved. A plurality of source/drain regions for MOS transistors are formed in a substrate. An insulating layer is formed overlying the substrate. The insulating layer has openings to expose a first source/drain region and a second source/drain region. A conductive layer is formed overlying the insulating layer and contacting the first and second source/drain regions. A metal wire is bonded to the conductive layer such that metal wire creates an electrical coupling of the first and the second source/drain regions to complete the very low resistivity interconnection in the manufacture of the integrated circuit device.

Also in accordance with the objects of the present invention, a low resistivity integrated circuit structure is achieved comprising, first, a diffusion layer in a substrate. The diffusion layer further comprises a first region and a second region. A conductive layer overlies the substrate with an insulating layer therebetween. The conductive layer contacts the first and second regions through openings in the insulating layer. Finally, an electrical coupling exists between the first region and the second region. The electrical coupling comprises a metal wire bonded to the conductive layer.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose a novel method and structure for reducing the resistivity of an interconnect in an integrated circuit device. The method and structure uses bonded metal wires, or stitches, on internal integrated circuit nodes to reduce resistivity of couplings. It should be clear to those experienced in the art that the present invention can be applied and extended without deviating from the scope of the present invention.

Figure 1:
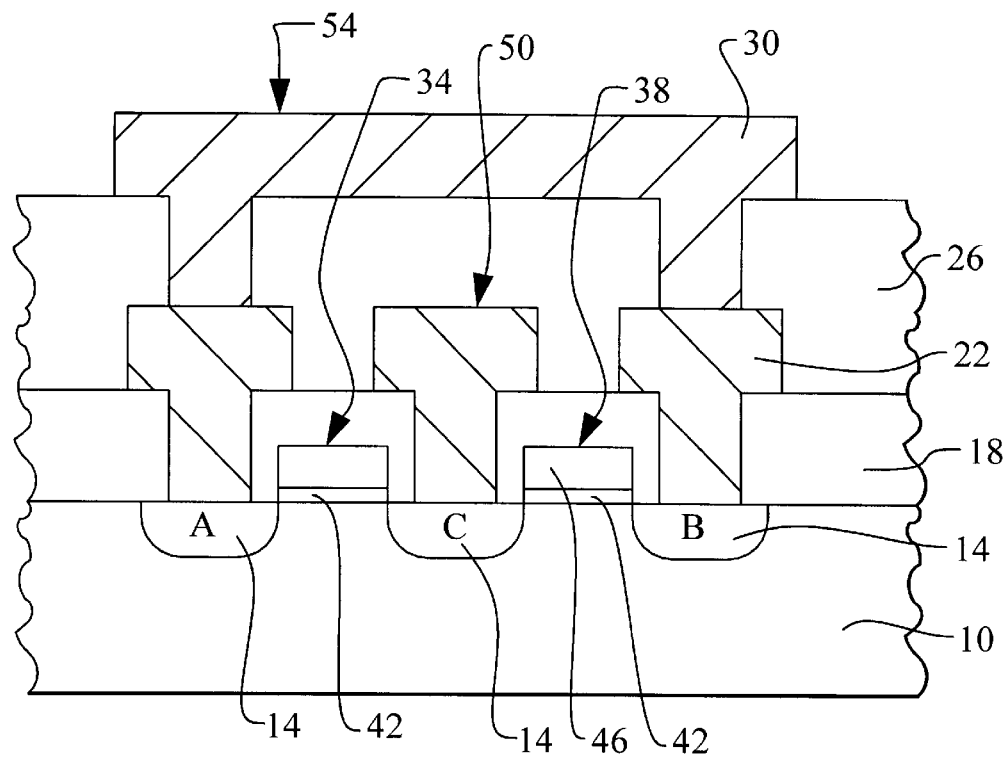
FIG. 1 illustrates an exemplary cross section of a prior art integrated circuit device.
Figure 2:
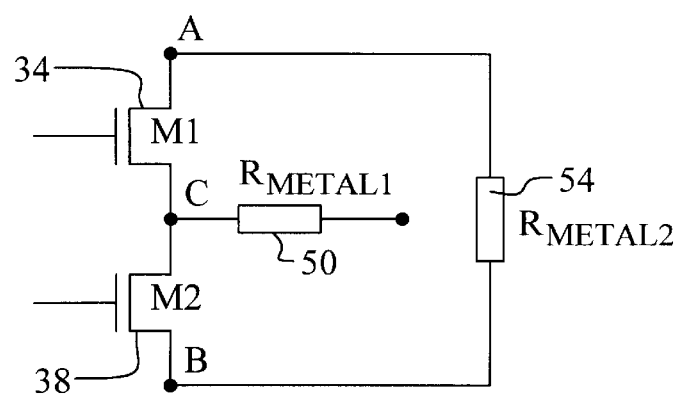
FIG. 2 illustrates a simplified model of the circuit of FIG. 1.
Figure 3:
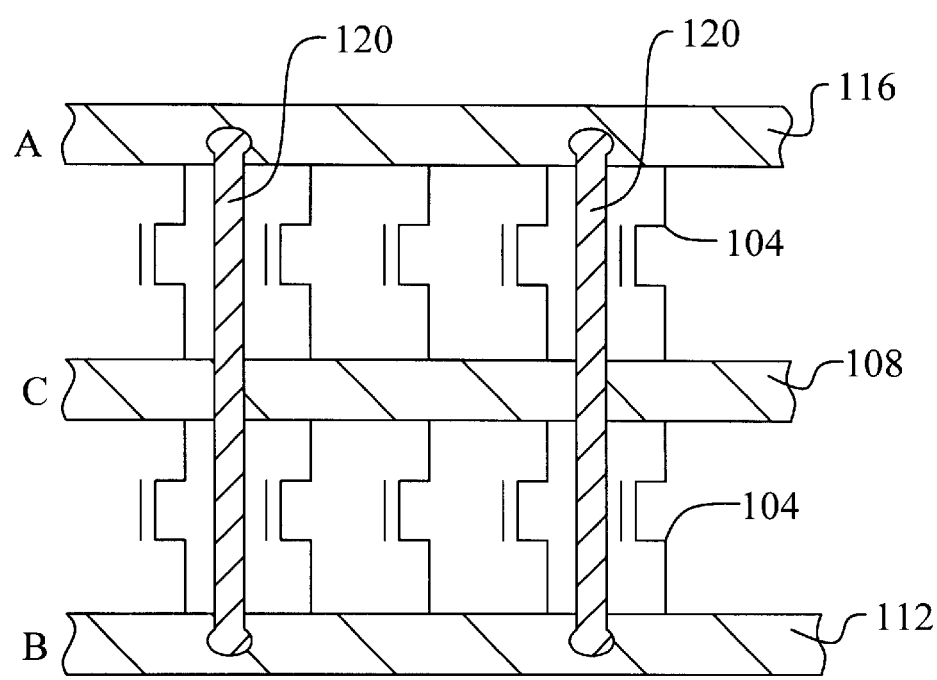
FIG. 3 illustrates the preferred embodiment of the present invention showing the use of metal stitches to reduce interconnect resistivity.

Referring now to FIG. 3, the preferred embodiment of the present invention is illustrated. Several important features of the present invention are shown. The novel use of metal stitches to reduce interconnect resistivity is shown. A series of transistors 104 are arranged in a means similar to that of FIG. 1. In this case, however, an array of transistors is used to provide an equivalent transistor of very large size. Such an arrangement would be used, for example, in a power output device. The source/drain regions of the parallel transistor stacks are labeled as A, B, and C. One set of source/drains is coupled to A by the metal line 116. The B set of source/drains is coupled to metal line 112. The C set of source/drains is coupled to metal line 108.

As in the prior art case, the presence of the C node prevents a direct connection of A and B using the metal lines 116 and 112. A second level of metal could be used for the connection, but this may not be sufficient to keep the resistivity low enough to meet the application requirements. To overcome this problem, metal stitches, or metal wires 120, are bonded to the metal lines 116 and 112 to provide a coupling path between A and B. These metal stitches may comprise, for example, gold wire that is ultrasonically welded to the exposed metal lines 116 and 112. The metal wires 120 have an inherently much lower unit resistivity than the metal film lines 112 and 116. Further, since several wires can be bonded in parallel, the resistance between A and B can be made very low. For example, a connection having a resistance of only a few milliOhms can be constructed. Finally, if multiple metal levels exist in the integrated circuit process, multiple parallel couplings can be made using both the metal film levels and the metal stitches. In this way, the final resistivity can be kept very low. In addition, the bonding areas for the metal wires require no additional circuit area and are therefore very space efficient.

Figure 4:
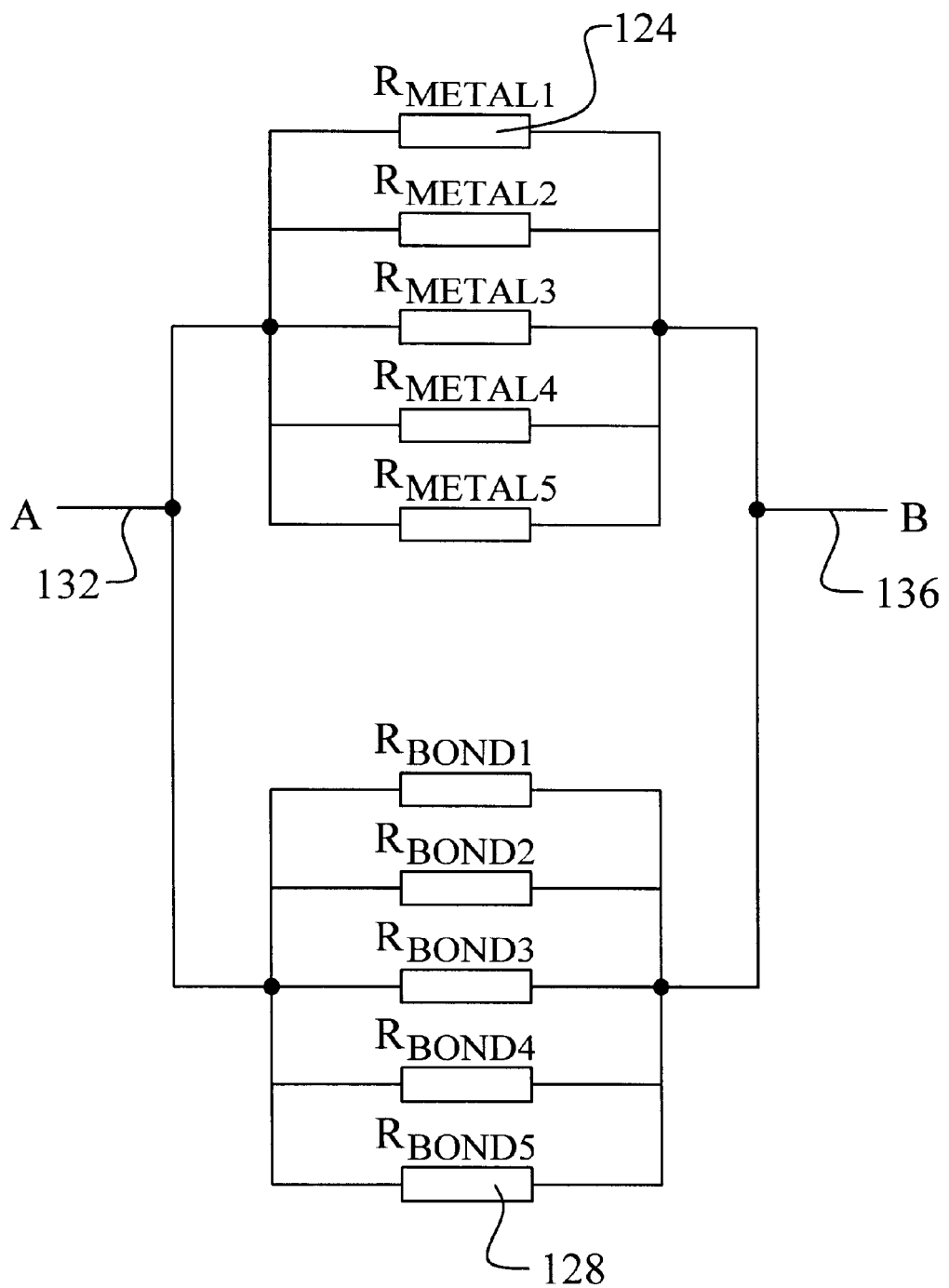
FIG. 4 illustrates a simplified model of the preferred embodiment of the present invention.

Referring now to FIG. 4, a simplified model of the preferred embodiment of the present invention is shown. Once again, several metal levels may exist in the process. In this example, five metal layers are used to form five parallel interconnections between internal nodes A 132 and B 136 having resistances $R_{metal1}$ through $R_{metal2}$ 124. At the same time, five wire bonds are used to couple the internal nodes A and B. The five wire bonds have resistances of $R_{bond1}$ through $R_{bond5}$ 128. The combined parallel resistance of the metal layer connections and the wire connections creates a very low resistivity connection.

Figure 5:
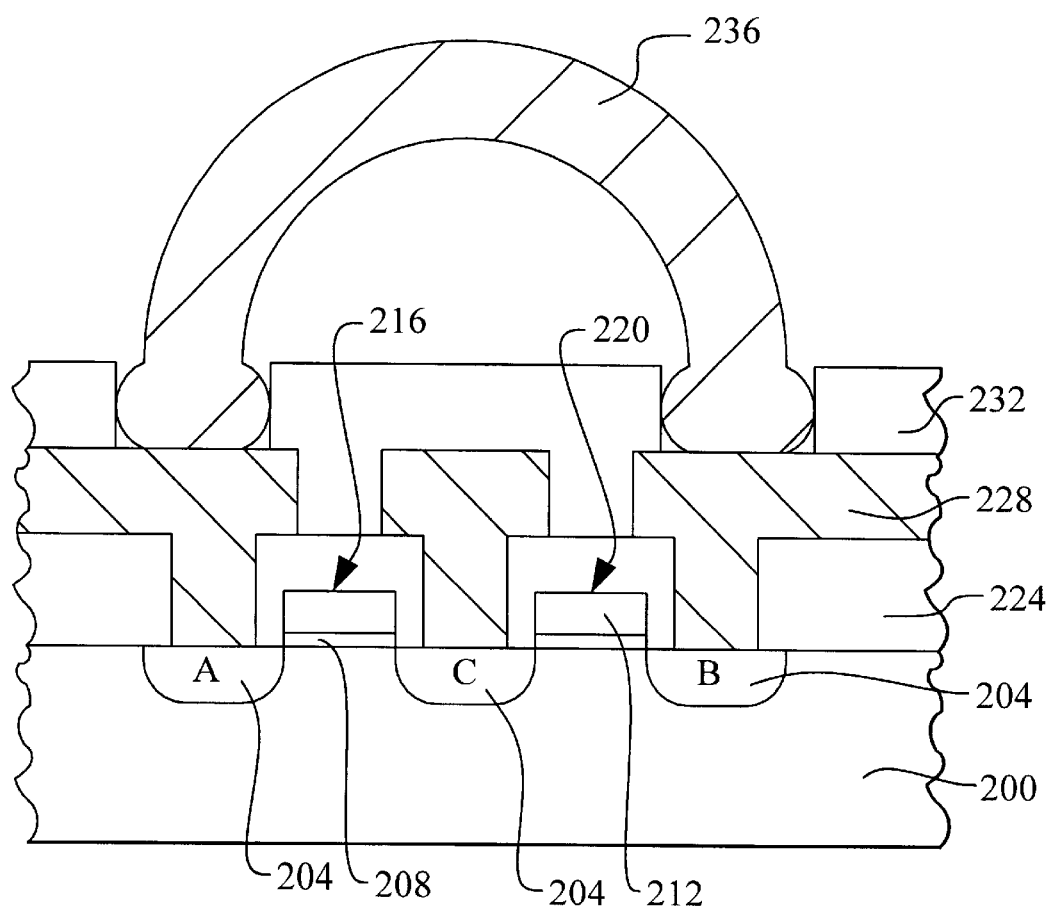
FIG. 5 illustrates in cross sectional representation the preferred embodiment showing a single stitch and a single metal layer.

Referring now to FIG. 5, a cross sectional view of the preferred embodiment of the present invention is shown. A plurality of source/drain regions 204 for MOS transistors 216 and 220 are formed in a substrate 200. An insulating layer 224 is formed overlying the substrate 200. The insulating layer 224 has openings to expose a first source/drain region A and a second source/drain region B. A conductive layer 228, preferably comprising a metal film such as aluminum, is formed overlying the insulating layer 224 and contacting the first and second source/drain regions, A and B. A metal wire 236 is bonded to the conductive layer 228 such that the metal wire 236 creates an electrical coupling of the first and the second source/drain regions A and B to complete the very low resistivity interconnection in the manufacture of the integrated circuit device. Note that a passivation layer 232 is formed overlying the conductive layer 228 to prevent shorting and to protect the conductive layer 228. The metal wire 236, which preferably comprises gold wire, is bonded to the exposed conductive layer. The wire bonding process preferably comprises an ultrasonic weld.

Figure 6:
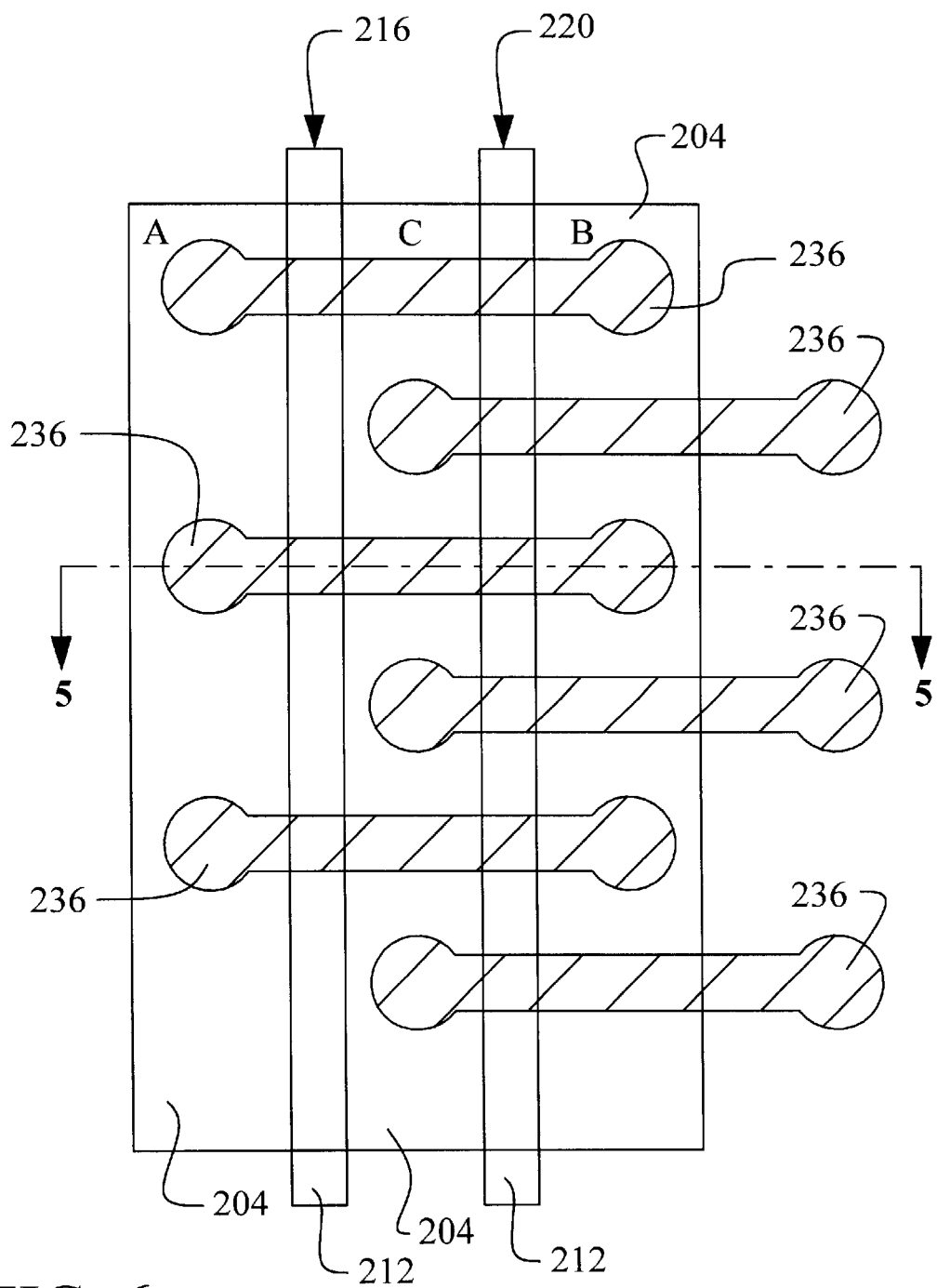
FIG. 6 illustrates a top view of the preferred embodiment showing multiple stitches in parallel.

Referring now to FIG. 6, a top view the preferred embodiment is shown. The two transistors 216 and 220 are formed where the polysilicon layer 212 crosses the active area 204. Three source/drain regions are defined as A, B, and C. Metal wires 236 are used to couple the A and B regions together. The metal wires 236 are bonded to the topmost metal layer, not shown. The metal wires 236 provide a very low resistivity path from A to B while not contacting the C region. Note that alternating metal wires are bonded to the C region to provide a low resistivity path that does not contact either the A or the B region. In addition, several metal wires 236 may be used to provide multiple parallel paths between two nodes.

Figure 7:
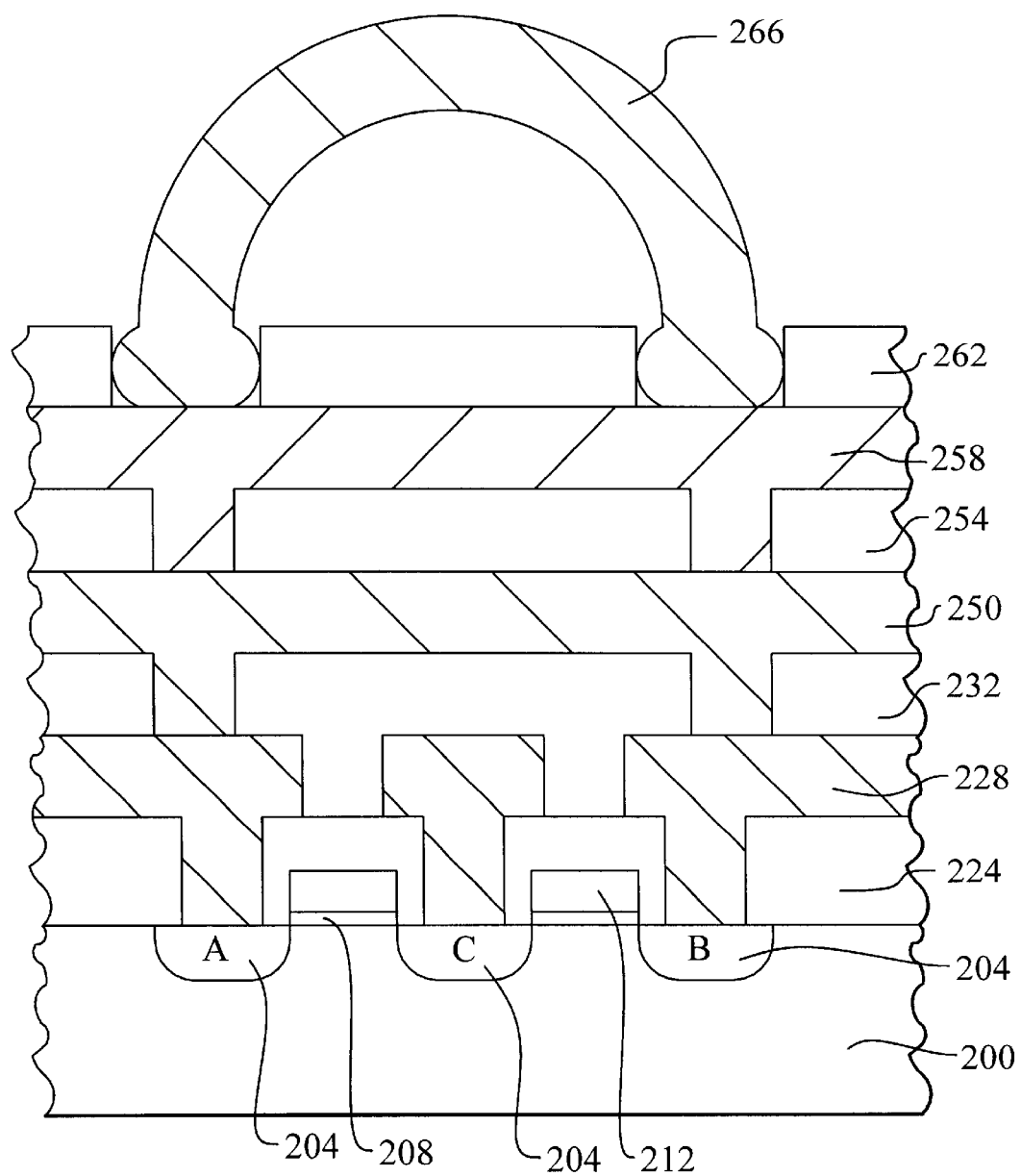
FIG. 7 illustrates in cross sectional representation the preferred embodiment showing a single stitch and multiple metal layers.

Referring now to FIG. 7, the preferred embodiment of the present invention is illustrated showing several conductive layers 228, 250, and 258. Note that the upper two metal layers 250 and 258 provide parallel couplings between the source/drain regions 204 labeled A and B. In practice, a plurality of metal layers may be used to provide parallel couplings at the same time that a plurality of metal wires are bonded to the uppermost layer to provide a combined plurality of coupling paths with a net very low resistivity.

Figure 8:
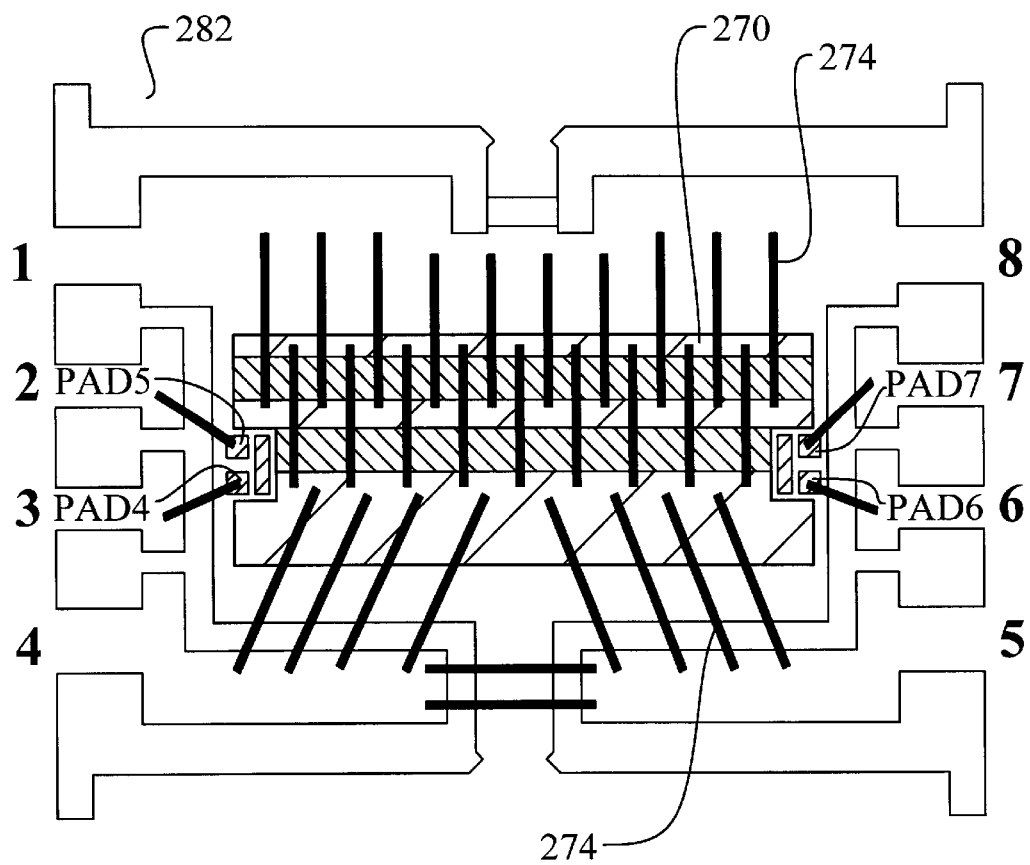
FIG. 8 illustrates the present invention used in a circuit application.

Referring now to FIG. 8, a circuit application using the present invention is illustrated. In this application, 282, a power device section 270 uses metal stitches 274 to lower the resistivity of current paths.

Referring again now to FIG. 5, the novel low resistivity integrated circuit structure may now be described. First, a diffusion layer 204 exists in a substrate 200. The diffusion layer 204 further comprises a first region A and a second region B. A conductive layer 228 overlies the substrate 200 with an insulating layer 224 therebetween. The conductive layer 228 contacts the first and second regions A and B through openings in the insulating layer 224. Finally, an electrical coupling 236 exists between the first region A and the second region B. The electrical coupling comprises a metal wire 236 bonded to the conductive layer 228.

The present invention provides an effective and very manufacturable method and structure to reduce interconnect resistivity in an integrated circuit device. A method to reduce interconnect resistivity while using a minimum of circuit area is provided. The interconnect resistivity is reduced by bonding metal wire or stitches to the uppermost metal interconnect layer. Multiple bonded metal wire interconnects and multiple conductive layers may be combined to minimize resistivity. A novel low resistivity structure for connecting diffusion regions, such as MOS source/drain regions is provided.

As shown in the preferred embodiments, the novel method and structure provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form a very low resistivity interconnection in the manufacture of an integrated circuit device comprising:

forming a bottom conductive layer overlying a substrate to form a first electrical coupling of a first location and a second location of said integrated circuit device;

forming a dielectric layer overlying said bottom conductive layer;

forming a top conductive layer overlying said dielectric layer wherein said top conductive layer is coupled to said bottom conductive layer through openings in said dielectric layer to form a second electrical coupling of said first location and said second location; and bonding a metal wire to said top conductive layer to form a third electrical coupling of said first location and said second location to complete said very low resistivity interconnection in the manufacture of said integrated circuit device.

2. The method according to claim 1 wherein said step of bonding comprises ultrasonic welding.

3. The method according to claim 1 further comprising bonding at least one additional metal wire to said top conductive to form at least one additional electrical coupling of said first location and said second location.

4. The method according to claim 1 further comprising at least one additional conductive layer between said bottom conductive layer and said top conductive layer to at least one additional electrical coupling of said first location and said second location.

5. The method according to claim 4 further comprising bonding at least one additional metal wire to said top conductive layer to form at least one additional electrical coupling of said first location and said second location.

6. The method according to claim 1 further comprising forming a passivation layer overlying said top conductive layer prior to said step of bonding wherein said passivation layer has bonding pad openings that expose said top conductive layer.

7. The method according to claim 1 further comprising:
forming a diffusion layer in said substrate; and
thereafter forming an insulating layer overlying said substrate prior to said step of forming said bottom conductive layer wherein openings in said insulating layer expose said diffusion layer such that said bottom conductive layer is coupled to said diffusion layer.

8. The method according to claim 7 wherein said diffusion layer comprises a plurality of source and drain regions for MOS transistors.

9. A method to form a very low resistivity interconnection in the manufacture of an integrated circuit device comprising:

forming a bottom conductive layer overlying a substrate to form a first electrical coupling of a first location and a second location of said integrated circuit device;

forming a dielectric layer overlying said bottom conductive layer;

forming a top conductive layer overlying said dielectric layer wherein said top conductive layer is coupled to said bottom conductive layer through openings in said dielectric layer to form a second electrical coupling of said first location and said second location; and bonding a metal wire to said top conductive layer to form a third electrical coupling of said first location and said second location to complete said very low resistivity interconnection in the manufacture of said integrated circuit device wherein said step of bonding comprises ultrasonic welding.

10. The method according to claim 9 further comprising bonding at least one additional metal wire to said top conductive to form at least one additional electrical coupling of said first location and said second location.

11. The method according to claim 9 further comprising at least one additional conductive layer between said bottom conductive layer and said top conductive layer to at least one additional electrical coupling of said first location and said second location.

12. The method according to claim 11 further comprising bonding at least one additional metal wire to said top conductive layer to form at least one additional electrical coupling of said first location and said second location.

13. The method according to claim 9 further comprising forming a passivation layer overlying said top conductive layer prior to said step of bonding wherein said passivation layer has bonding pad openings that expose said top conductive layer.

14. The method according to claim 9 further comprising:
forming a diffusion layer in said substrate; and
thereafter forming an insulating layer overlying said substrate prior to said step of forming said bottom conductive layer wherein openings in said insulating layer expose said diffusion layer such that said bottom conductive layer is coupled to said diffusion layer.

15. The method according to claim 14 wherein said diffusion layer comprises a plurality of source and drain regions for MOS transistors.

16. A method to form a very low resistivity interconnection in the manufacture of an integrated circuit device comprising:

forming a bottom conductive layer overlying a substrate to form a first electrical coupling of a first location and a second location of said integrated circuit device;

forming a dielectric layer overlying said bottom conductive layer;

forming a top conductive layer overlying said dielectric layer wherein said top conductive layer is coupled to said bottom conductive layer through openings in said dielectric layer to form a second electrical coupling of said first location and said second location;

forming a passivation layer overlying said top conductive layer wherein said passivation layer has bonding pad openings that expose said top conductive layer; and bonding a metal wire to said top conductive layer to form a third electrical coupling of said first location and said second location to complete said very low resistivity interconnection in the manufacture of said integrated circuit device wherein said step of bonding comprises ultrasonic welding.

17. The method according to claim 16 further comprising bonding at least one additional metal wire to said top conductive to form at least one additional electrical coupling of said first location and said second location.

18. The method according to claim 16 further comprising at least one additional conductive layer between said bottom conductive layer and said top conductive layer to at least one additional electrical coupling of said first location and said second location.

19. The method according to claim 18 further comprising bonding at least one additional metal wire to said top conductive layer to form at least one additional electrical coupling of said first location and said second location.

20. The method according to claim 16 further comprising:
forming a diffusion layer in said substrate; and
thereafter forming an insulating layer overlying said substrate prior to said step of forming said bottom conductive layer wherein openings in said insulating layer expose said diffusion layer such that said bottom conductive layer is coupled to said diffusion layer.

* * * * *

UNITED STATES PATENT AND TRADEMARK OFFICE
CERTIFICATE OF CORRECTION

PATENT NO.     : 6,569,758 B2
DATED          : May 27, 2003
INVENTOR(S)    : Wolfgang Jorger et al.

It is certified that error appears in the above-identified patent and that said Letters Patent is hereby corrected as shown below:

<u>Title page,</u>
Item [75], Inventors, delete "Achim Stellberger, Kronan (DE)" and "Michael Keller, Heideberg (DE)" and replace it with -- Achim Stellberger, Kronau (DE) -- and -- Michael Keller, Heidelberg (DE) -- respectively.

Signed and Sealed this

Ninth Day of September, 2003

JAMES E. ROGAN
*Director of the United States Patent and Trademark Office*